(12) United States Patent
Huang et al.

(10) Patent No.: US 10,831,313 B1
(45) Date of Patent: Nov. 10, 2020

(54) TOUCH PANEL HAVING AN ISLAND INSULATOR

(71) Applicant: Wistron Corporation, New Taipei (TW)

(72) Inventors: Kung-Chieh Huang, New Taipei (TW); Chia-Cheng Su, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/509,508

(22) Filed: Jul. 12, 2019

(30) Foreign Application Priority Data

Apr. 25, 2019 (TW) .............................. 108114433 A

(51) Int. Cl.
*G06F 3/041* (2006.01)
*H03K 17/96* (2006.01)

(52) U.S. Cl.
CPC ......... *G06F 3/04164* (2019.05); *H03K 17/96* (2013.01); *H03K 2017/9602* (2013.01)

(58) Field of Classification Search
CPC .................................................. G06F 3/04164
See application file for complete search history.

(56) References Cited

U.S. PATENT DOCUMENTS

2019/0102002 A1\* 4/2019 Lee .......................... G06F 3/045

FOREIGN PATENT DOCUMENTS

TW 201702848 1/2017

OTHER PUBLICATIONS

"Office Action of Taiwan Counterpart Application", dated Mar. 18, 2020, p. 1-p. 6.

\* cited by examiner

*Primary Examiner* — Gustavo Polo
(74) *Attorney, Agent, or Firm* — JCIPRNET

(57) ABSTRACT

A touch panel including a substrate, a plurality of sensing electrodes, a bridge line, a connection line and an island insulator is provided. The sensing electrodes are disposed on the substrate in parallel. The bridge line is disposed on the substrate and connected between two of the sensing electrodes. The connection line is disposed on the substrate and connected between another two of the sensing electrodes. The bridge line intersects the connection line. The island insulator is disposed on the substrate and covers the bridge line. The bridge line is completely encapsulated between the island insulator and the substrate. The island insulator includes a central portion and a distal portion extended from the central portion. A width of the distal portion is gradually reduced outwardly from the central portion.

16 Claims, 6 Drawing Sheets

TOUCH PANEL HAVING AN ISLAND INSULATOR

CROSS-REFERENCE TO RELATED APPLICATION

This application claims the priority benefit of Taiwan application serial no. 108114433, filed on Apr. 25, 2019. The entirety of the above-mentioned patent application is hereby incorporated by reference herein and made a part of this specification.

BACKGROUND OF THE INVENTION

1. Field of the Invention

The invention relates to an electronic device, and more particularly, to a touch panel.

2. Description of Related Art

Touch panels have been widely applied to products in various fields to provide intuitive and convenient input operation interfaces. In many products, the touch panel realizes a touch sensing function by a serial electrode array in which a plurality of horizontal electrode strings intersecting a plurality of vertical electrode strings are arranged. In addition, a bridging structure (e.g., a bridge line and an insulation layer for separate the bridge line from another string) may be used at intersections between the horizontal electrode strings and the vertical electrode strings to avoid short circuit between two strings. However, the visibility of the bridge line is often a phenomenon that should be avoided when designing the touch panel. In particular, when the touch panel is applied to a display panel or a display device, the visibility of the bridge line that can reduce a displaying quality is expected to be as low as possible.

SUMMARY OF THE INVENTION

The invention provides a touch panel that helps to reduce the visibility of the members to improve applicability of the touch panel.

The touch panel of the invention includes a substrate, a plurality of sensing electrodes, a bridge line, a connection line and an island insulator. The sensing electrodes are disposed on the substrate in parallel. The bridge line is disposed on the substrate and connected between two of the sensing electrodes. The connection line is disposed on the substrate and connected between another two of the sensing electrodes. The bridge line intersects the connection line. The island insulator is disposed on the substrate and covers the bridge line. The bridge line is completely encapsulated between the island insulator and the substrate. The island insulator includes a central portion and a distal portion extended from the central portion. A width of the distal portion is gradually reduced outwardly from the central portion.

In an embodiment of the invention, at least a part of the distal portion obliquely intersects an extending direction of the bridge line.

In an embodiment of the invention, an extending direction of the island insulator is substantially identical to an extending direction of the bridge line.

In an embodiment of the invention, the width of the distal portion is gradually reduced outwardly from the central portion in a direction. A contour of the distal portion has an end and a side edge connected between the end and the central portion. A distance between two ends of the side edge in the direction is L, a distance between the bridge line and the end in the direction is r, a line width of the bridge line is w, an extending length of the end is h, an included angle of the side edge with respect to the direction is $\Theta$, and $L=(h-w)/2-r\times\tan(\Theta/2)$.

In an embodiment of the invention, $\Theta$ is from 30 degrees to 60 degrees.

In an embodiment of the invention, r is from 5 μm to 30 μm.

In an embodiment of the invention, the bridge line extends in the direction.

In an embodiment of the invention, an overall length of the island insulator in the direction is Loc, an overall length of the bridge line in the direction is Lbr, and $r=(Loc-Lbr)/2$.

In an embodiment of the invention, the central portion has a zigzag edge or a step-like edge.

In an embodiment of the invention, a thickness of the central portion is reduced outwardly from a center of the central portion.

In an embodiment of the invention, a thickness of the central portion at a reference point is ½ of a maximum thickness of the central portion, a distance from the reference point extending outwardly to an outer edge of the central portion is from 5 μm to 10 μm.

In an embodiment of the invention, the width of the distal portion is gradually reduced outwardly from the central portion at a constant rate.

In an embodiment of the invention, the touch panel further includes a separation insulator. The separation insulator is disposed between the bridge line and the connection line.

In an embodiment of the invention, an exceeding width of the separation insulator exceeding outwardly from a lateral edge of the bridge line is from 5 μm to 30 μm.

In an embodiment of the invention, the island insulator covers the separation insulator. An exceeding width of the island insulator exceeding from a lateral edge of the separation insulator is from 5 μm to 30 μm.

In an embodiment of the invention, the separation insulator is completely encapsulated between the island insulator and the substrate.

In an embodiment of the invention, the connection line is integrally formed with said another two of the sensing electrode.

Based on the above, according to the embodiments of the invention, the touch panel is disposed with the island insulator covering the bridge line, and the contour of the island insulator has a non-rectangular shape. In this way, the reflective light generated in accordance with the contour of the island insulator can be emitted towards diverging directions, so as to help reducing the visibility of the island insulator and the members covered by the island insulator. Accordingly, when being applied to the display panel or the display device, the touch panel according to the embodiments of the invention facilitates to maintain an ideal displaying quality.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
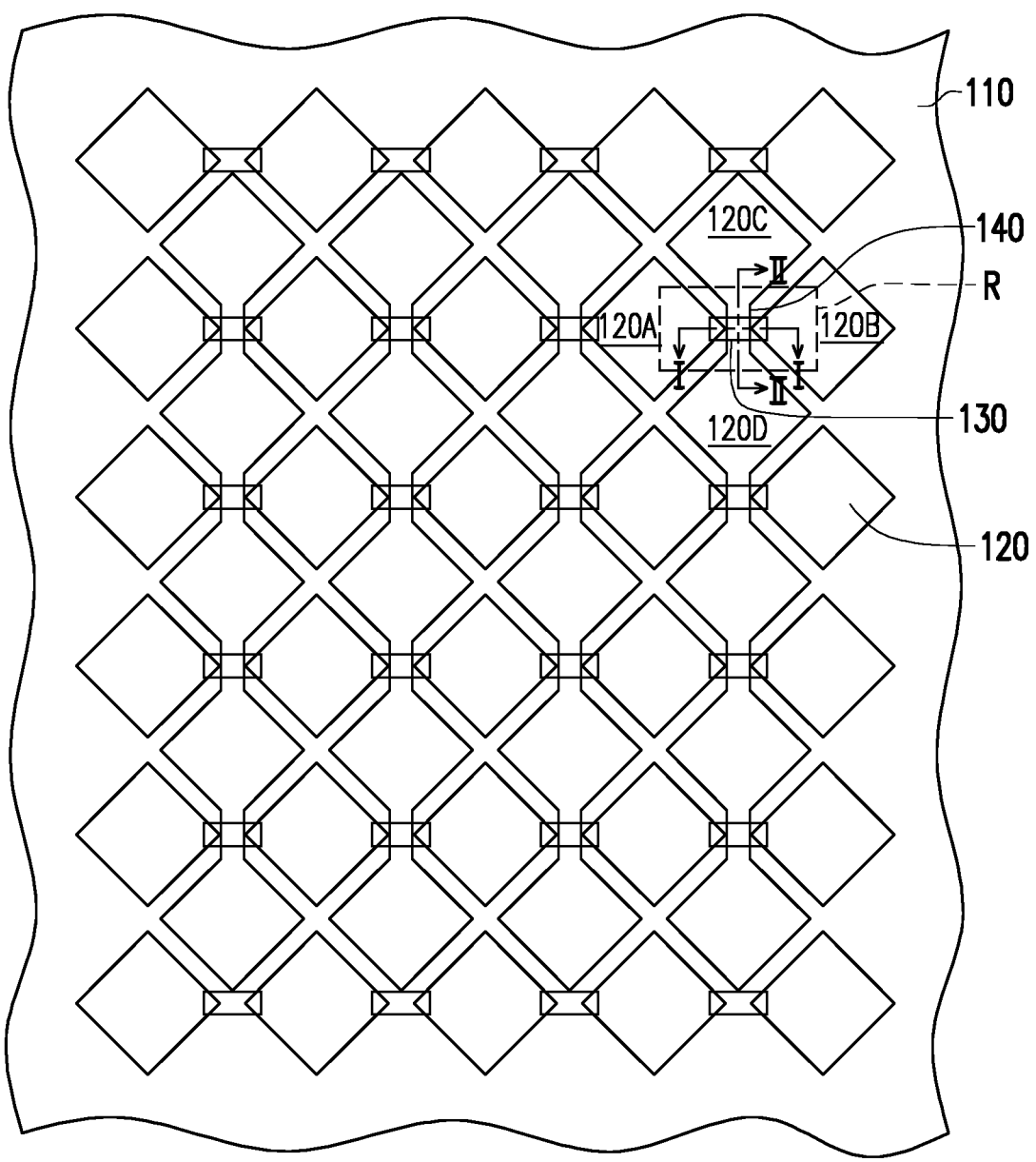
FIG. 1 is a top view of a touch panel in an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

FIG. 1 is a top view of a touch panel in an embodiment of the invention. In FIG. 1, a touch panel 100 includes a substrate 110, a plurality of sensing electrodes 120, a plurality of bridge lines 130 and a plurality of connection lines 140. The sensing electrodes 120 are disposed on the substrate 110 in parallel and arranged in an array. In this embodiment, each of the sensing electrodes 120 is substantially in shape of rhombus. However, in other embodiments, shape, size and layout of each of the sensing electrodes 120 may be adjusted based on design requirements. The bridge lines 130 and the connection lines 140 are disposed on the substrate 110, and configured to connect the sensing electrodes 120 into a plurality of sensing electrode strings. Among them, the sensing electrode strings connected by the bridge lines 130 and the sensing electrode strings connected by the connection lines 140 respectively extend in different directions. Although FIG. 1 shows a plurality of bridge lines 130 and a plurality of connecting lines 140, the following description is provided with use of one of the bridge lines 130 and one of the connection lines 140 as an example since the connection relationships of the bridge lines 130 and the connecting lines 140 with respect to the sensing electrodes 120 substantially follow the same rule. The bridge line 130 is configured to be connected between two of the sensing electrodes 120, such as a sensing electrode 120A and a sensing electrode 120B. The connection line 140 is configured to be connected between another two of the sensing electrodes 120, such as a sensing electrode 120C and a sensing electrode 120D. Each of the bridge lines 130 intersects the corresponding connection line 140.

Figure 2:
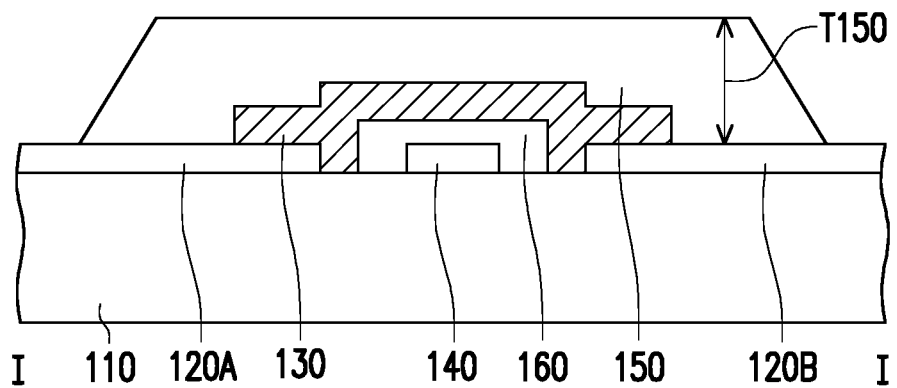
FIG. 2 is a cross-sectional view of the touch panel of FIG. 1 along line I-I.
Figure 3:
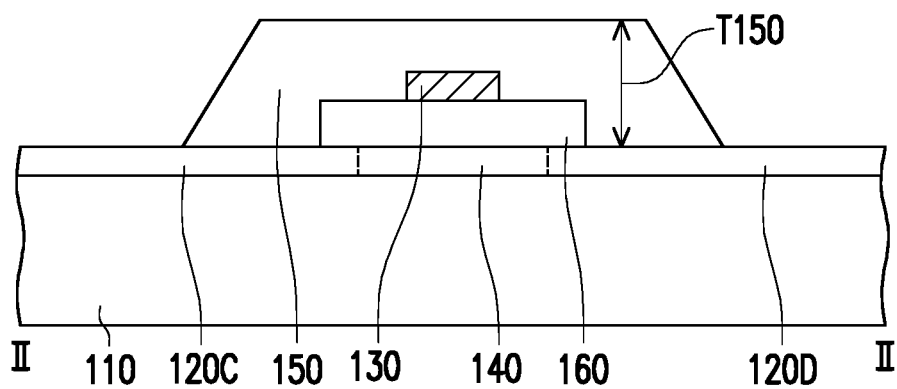
FIG. 3 is a cross-sectional view of the touch panel of FIG. 1 along line II-II.

Specifically, FIG. 2 is a cross-sectional view of the touch panel of FIG. 1 along line I-I, and FIG. 3 is a cross-sectional view of the touch panel of FIG. 1 along line II-II. Referring to FIG. 2 and FIG. 3 together, in addition to the sensing electrodes 120, the bridge lines 130 and the connection line 140, the touch panel 100 further includes an island insulator 150 and a separation insulator 160. The island insulator 150 is disposed on the substrate 110 and covers the bridge line 130, and the bridge line 130 is completely encapsulated between the island insulator 150 and the substrate 110. Accordingly, the bridge line 130 may be encapsulated by the island insulator 150 without being easily damaged to thereby help improving the quality of the touch panel 100. Further, in order to isolate the bridge line 130 from the connection line 140, the separation insulator 160 is disposed between the bridge line 130 and the connection line 140. The separation insulator 160 may also be completely encapsulated between the island insulator 150 and the substrate 110.

In this embodiment, the sensing electrode 120 and the connection line 140 may be made by the same film layer and material. Therefore, as shown by FIG. 3, the sensing electrode 120C, the sensing electrode 120D are integrally formed with the connection line 140. In other words, no structural/physical boundary exists between the sensing electrode 120C and the connection line 140, and no structural/physical boundary exists between the sensing electrode 120D and the connection line 140. Nonetheless, in other embodiments, the connection line 140 may be made by adopting a film layer or a material different from those of the sensing electrode 120. Accordingly, the physical boundary may exist between the sensing electrode 120C and the connection line 140 and between the sensing electrode 120D and the connection line 140. In addition, the bridge line 130 is made by a film layer different from that of the sensing electrode 120. In this embodiment, the sensing electrode 120 and the connection line 140 may be made before the separation insulator 160 is made, and the bridge line 130 may be made after the separation insulator 160 is made. Nonetheless, in other embodiments, the bridge line 130 may be made before the separation insulator 160 is made, and the sensing electrode 120 and the connection line 140 may be made after the separation insulator 160 is made. In certain embodiments, a material of the bridge line 130 may be identical to a material of the sensing electrode 120 or different from the material of the sensing electrode 120. For instance, the material of the sensing electrode 120 includes transparent and conductive organic or inorganic materials, such as ITO, IZO, and the like. The material of the bridge line 130 may include the transparent and conductive organic or inorganic materials, or solid metal with ideal conductivity, such as Al, Mo, Cu, Ag, and the like.

Figure 4:
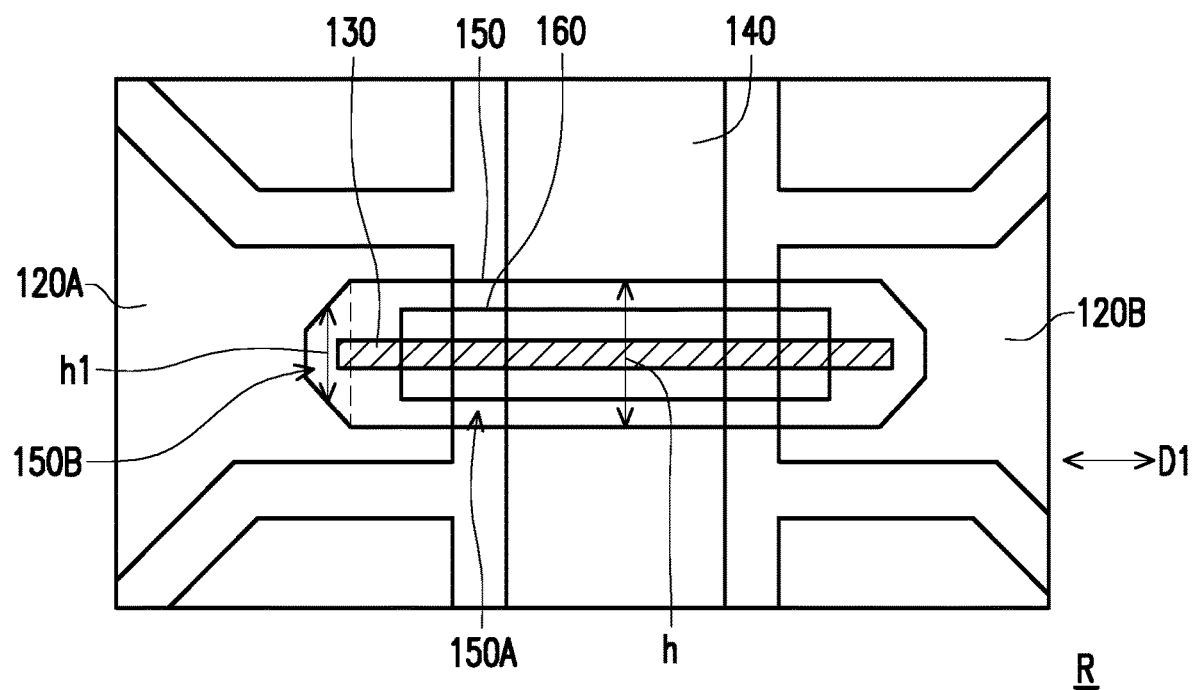
FIG. 4 is a partially-enlarged schematic diagram of a region R of a touch panel of FIG. 1 in an embodiment.
Figure 5:
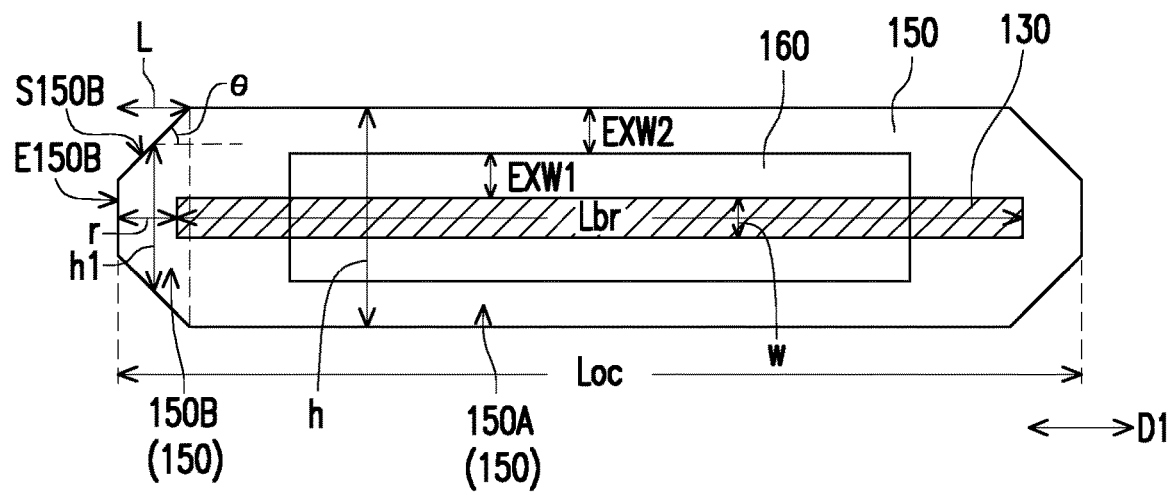
FIG. 5 shows contours of an island insulator 150 and a bridge line 130 and a separation insulator 160 covered by the island insulator 150 in a top view.

FIG. 4 is a partially-enlarged schematic diagram of a region R of a touch panel of FIG. 1 in an embodiment. FIG. 5 shows contours of an island insulator 150 and a bridge line 130 and a separation insulator 160 covered by the island insulator 150 in a top view. In FIG. 4 and FIG. 5, an extending direction of the bridge line 130 is a direction D1, and the island insulator 150 and the separation insulator 160 also extend in the direction D1 in accordance with the bridge line 130. Here, substantially, a contour of the separation insulator 160 forms a rectangular shape and a contour of the island insulator 150 forms a non-rectangular shape.

Specifically, the island insulator 150 includes a central portion 150A and a distal portion 150B extended from the central portion 150A. In this embodiment, a width h of the central portion 150A is substantially fixed, a width h1 of the distal portion 150B is varied, and the width h1 of the distal portion 150B is not greater than the width h of the central portion 150A. The central portion 150A of the island insulator 150 substantially extends in the extending direction (the direction D1) of the bridge line 130, and the width h of the distal portion 150B is gradually reduced outwardly from the central portion 150A in the direction D1, for example. Accordingly, at least a part of the contour of the distal portion 150B obliquely intersects the extending direction (the direction D1) of the bridge line 130.

In this embodiment, the width h1 of the distal portion 150B is reduced outwardly at a constant rate from the central portion 150A, for example. The contour of the distal portion 150B has an end E150B and a side edge S150B connected between the end E150B and the central portion 150A. A distance between two ends of the side edge S150B in the direction D1 is L, a distance between the bridge line 130 and the end E150B in the direction D1 is r, a line width of the bridge line 130 is w, a width of the central portion 150A is h, and $L=(h-w)/2-r \times \tan(\Theta/2)$ when an included angle of the side edge S150B with respect to the direction D1 is $\Theta$. In certain embodiments, $\Theta$ may be from 30 degrees to 60 degrees or may even be selected as 45 degree, but not limited thereto.

An overall length of the island insulator 150 in the direction D1 is Loc, an overall length of the bridge line 130 in the direction D1 is Lbr, and a relationship between Loc, Lbr and r can be: $r=(Loc-Lbr)/2$. In certain embodiments, r may be set to an allowable distance of process error. In this way, after r and Lbr are determined, a desired size of Loc may then be obtained, but not limited thereto. In some embodiments, r is, for example, from 5 μm to 30 μm, but not limited thereto. In addition, in order to avoid short circuit between the bridge line 130 and the connection line 140, a width of the separation insulator 160 is greater than the line width w of the bridge line 130, and a width of the island insulator 150 is greater than the width of the separation insulator 160. For instance, an exceeding width EXW1 of the separation insulator 160 exceeding outwardly from a lateral edge of the bridge line 130 may be from 5 μm to 30 μm, and an exceeding width EXW2 of the island insulator 150 exceeding from a lateral edge of the separation insulator 160 may be from 5 μm to 30 μm. In certain embodiments, sizes of the exceeding widths EXW1 and EXW2 may be equal to a size of the distance r, or may be adjusted according to conditions such as a process capability, a touch panel size, and a touch control resolution. However, the width of each member needs to be sufficient to avoid short circuit between the bridge line 130 and the connecting line 140.

Figure 6:
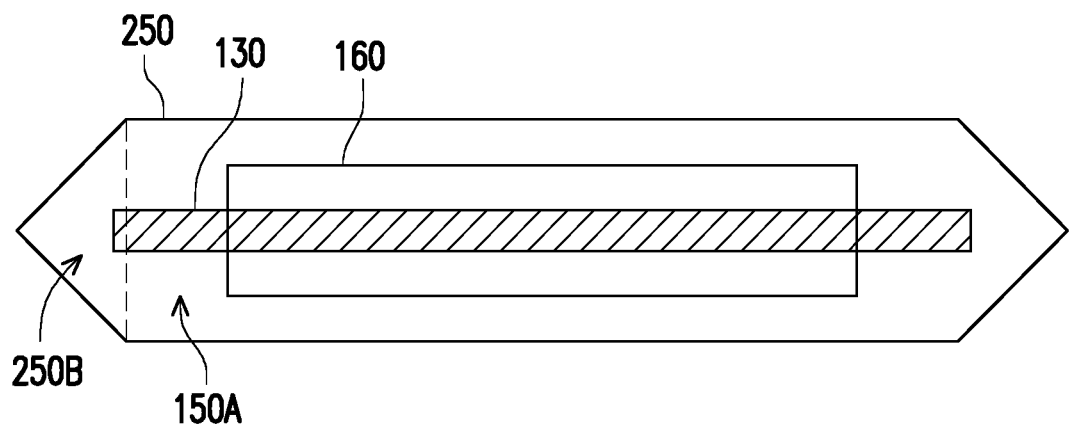
FIG. 6 shows contours of an island insulator 250 and the bridge line 130 and the separation insulator 160 covered by the island insulator 250 in another embodiment of the invention.

In FIG. 5, the width h1 of the distal portion 150B is, for example, reduced outwardly at a constant rate in the direction D1 from the central portion 150A until the end E150B. In this case, a difference between a maximum width and a minimum width (a width measured at the end E150B) of the width h1 of the distal portion 150B is, for example, less than one half of the width h of the central portion 150A, but not limited thereto. FIG. 6 shows contours of an island insulator 250 and the bridge line 130 and the separation insulator 160 covered by the island insulator 250 in another embodiment of the invention. In FIG. 6, a relative configuration relationship of the island insulator 250, the bridge line 130 and the separation insulator 160 is substantially identical to that of the island insulator 150, the bridge line 130 and the separation insulator 160 described above. Therefore, arrangement positions, materials and stacking relationship of the island insulator 250, the bridge line 130 and the partition insulator 160 in the touch panel may be understood with reference to the foregoing description. In this embodiment, the island insulator 250 differs from the island insulator 150 described above in that, the island insulator 250 includes the central portion 150A and a distal portion 250B. Here, a width h1 of the distal portion 250B is, for example, reduced outwardly from the central portion 150A at a constant rate and reduced to be substantially zero. In this way, an end of the distal portion 250B is substantially in shape of a sharp corner.

Figure 7:
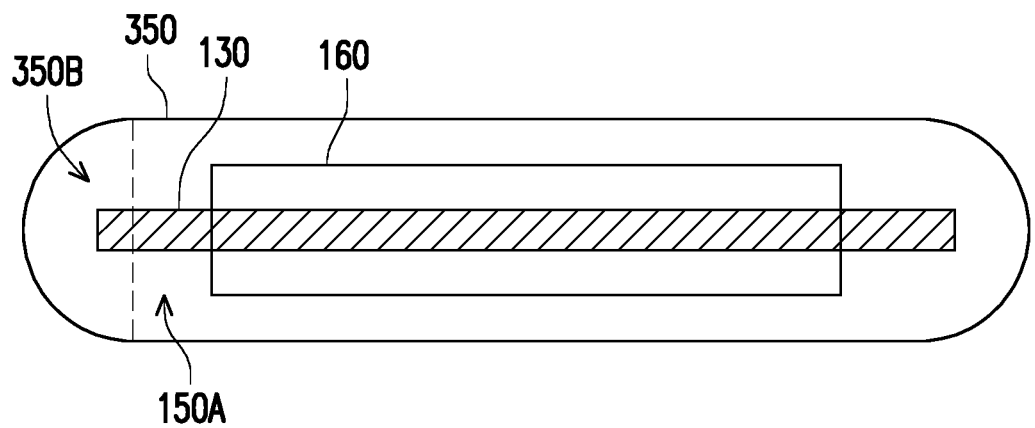
FIG. 7 shows contours of an island insulator 350 and the bridge line 130 and the separation insulator 160 covered by the island insulator 350 in yet another embodiment of the invention.

FIG. 7 shows contours of an island insulator 350 and the bridge line 130 and the separation insulator 160 covered by the island insulator 350 in yet another embodiment of the invention. In FIG. 7, a relative configuration relationship of the island insulator 350, the bridge line 130 and the separation insulator 160 is substantially identical to that of the island insulator 150, the bridge line 130 and the separation insulator 160 described above. Therefore, arrangement positions, materials and stacking relationship of the island insulator 350, the bridge line 130 and the partition insulator 160 in the touch panel may be understood with reference to the foregoing description. In this embodiment, the island insulator 350 differs from the island insulator 150 described above in that, the island insulator 350 includes the central portion 150A and a distal portion 350B. Here, a width h1 of the distal portion 350B is, for example, gradually reduced outwardly at an inconstant rate from the central portion 150A. In this way, an included angle $\Theta$ of the distal portion 350B with respect to the direction is varied, and the contour of the distal portion 350B is substantially in curved shape. In other words, the island insulator 350 substantially includes a contour of oblong.

Regardless of what rate of variation the width h1 has, a light reflected by the distal portion 150B, 250B or 350B and a light reflected by the central portion 150A will travel in different directions. Therefore, when the user uses the touch panel 100, the visibility of the island insulator 150, 250 or 350 is reduced. In addition, the configuration of the distal portion 150B, 250B and 350B can result in an oblique reflective light to also help reducing the visibility of the bridge line 130 or the separation insulator 160. Therefore, the island insulator 150, 250 or 350 with the varied width disposed in the touch panel 100 can help improving the displaying quality for the touch panel 100. In other words, when the touch panel 100 is used in combination with the display device or the display panel, the displaying quality will not be easily deteriorated due to the visibility of the bridge line 130 and its corresponding structure.

Figure 8:
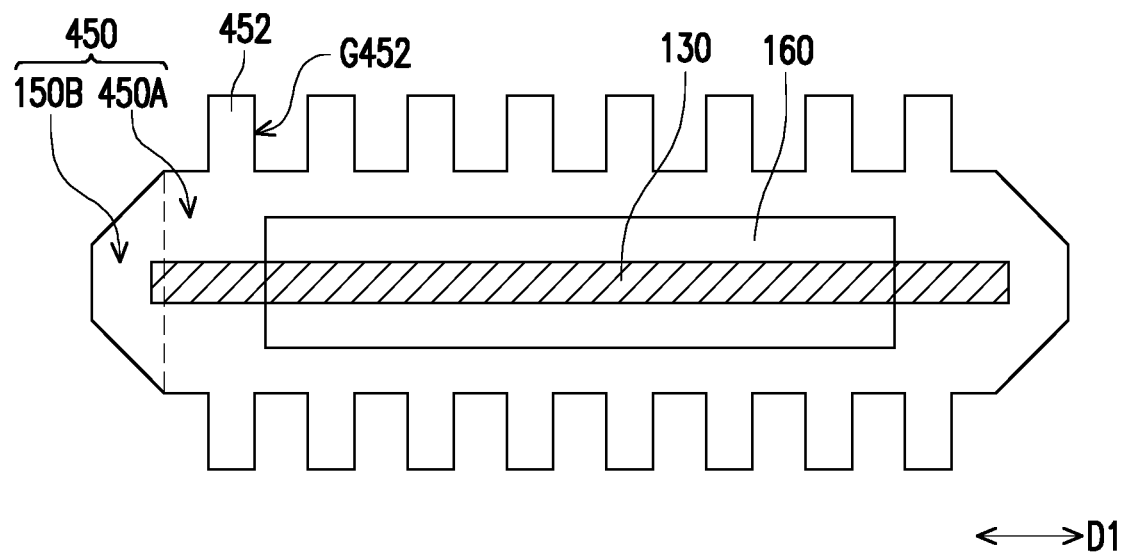
FIG. 8 shows contours of an island insulator 450 and the bridge line 130 and the separation insulator 160 covered by the island insulator 450 in still another embodiment of the invention.

FIG. 8 shows contours of an island insulator 450 and the bridge line 130 and the separation insulator 160 covered by the island insulator 450 in still another embodiment of the invention. In FIG. 8, a relative configuration relationship of the island insulator 450, the bridge line 130 and the separation insulator 160 is substantially identical to that of the island insulator 150, the bridge line 130 and the separation insulator 160 described above. Therefore, arrangement positions, materials and stacking relationship of the island insulator 450, the bridge line 130 and the partition insulator 160 in the touch panel may be understood with reference to the foregoing description. In this embodiment, the island insulator 450 differs from the island insulator 150 described above in that, the island insulator 450 includes a central portion 450A and the distal portion 150B. Here, the contour of the distal portion 150B may also be modified to similar contours of the distal portion 250B or 350B. The central portion 450A has a step-like edge in this embodiment. Specifically, the central portion 450A has a plurality of side edge patterns 452, and the side edge patterns 452 are spaced apart from each other by a gap G452. Each of the side edge patterns 452 may be a rectangular or square pattern, but not limited thereto.

A width of each of the side edge patterns 452 in the direction D1 is, for example, from 10 μm to 20 μm and a size of each gap G452 is, for example, from 10 μm to 20 μm. However, the invention is not limited in this regard.

Figure 9:
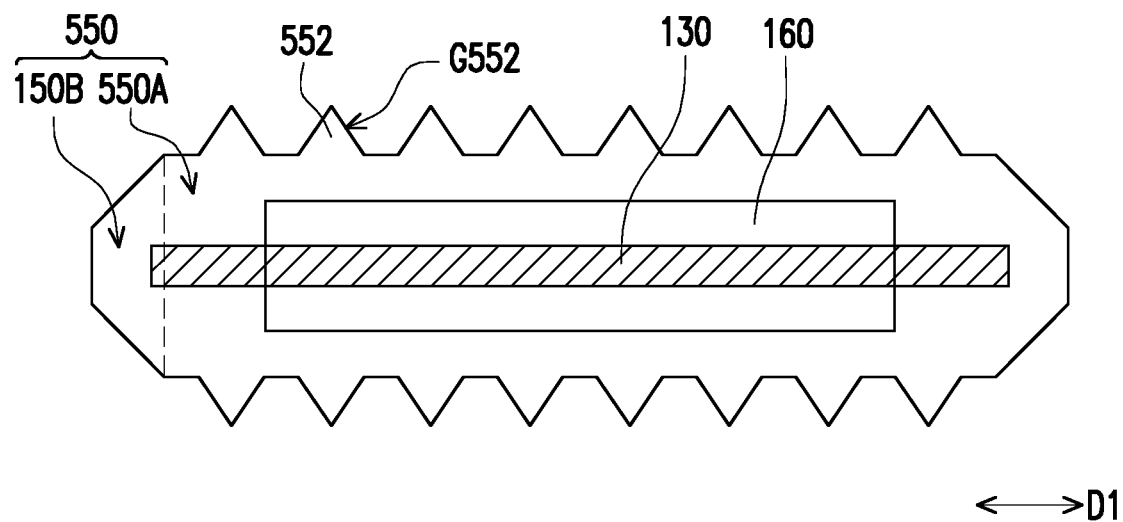
FIG. 9 shows contours of an island insulator 550 and the bridge line 130 and the separation insulator 160 covered by the island insulator 550 in yet another embodiment of the invention.

FIG. 9 shows contours of an island insulator 550 and the bridge line 130 and the separation insulator 160 covered by the island insulator 550 in yet another embodiment of the invention. In FIG. 9, a relative configuration relationship of the island insulator 550, the bridge line 130 and the separation insulator 160 is substantially identical to that of the island insulator 150, the bridge line 130 and the separation insulator 160 described above. Therefore, arrangement positions, materials and stacking relationship of the island insulator 550, the bridge line 130 and the partition insulator 160 in the touch panel may be understood with reference to the foregoing description. In this embodiment, the island insulator 550 differs from the island insulator 150 described above in that, the island insulator 550 includes a central portion 550A and the distal portion 150B. Here, the contour of the distal portion 150B may also be modified to similar contour of the distal portions 250B or 350B. The central portion 550A has a zigzag edge in this embodiment. Specifically, the central portion 550A has a plurality of side edge patterns 552, and the side edge patterns 552 are spaced apart from each other by a gap G552. Here, a width of the side edge pattern 552 measured in the direction D1 is reduced outwardly, and a width of the gap G552 measured in the direction D1 is increased outwardly. In this embodiment, the width of the side edge pattern 552 in the direction D1 is reduced outwardly at a constant rate to include a sharp corner contour. Nevertheless, in this embodiment, the width of the side edge pattern 552 in the direction D1 may also be reduced outwardly at an inconstant rate to include a curve contour.

In the embodiments of FIG. 8 and FIG. 9, in addition to the distal portion 150B having an inconstant width, the island insulators 450 and 550 also include the central portions 450A and 550A having an inconstant width. The light reflected by the island insulators 450 and 550 can travel in various directions without being concentrated in a specific direction to help reducing the visibility of the island insulators 450 and 550. Further, the configuration of the island insulators 450 and 550 may result in multi-directional reflective light which can also help to reduce the visibility of the bridge line 130 or the separation insulator 160. Therefore, by applying the touch panel 100 having the island insulators 450 and 550 to the display device or the display panel, display quality cannot be easily deteriorated.

Figure 10:
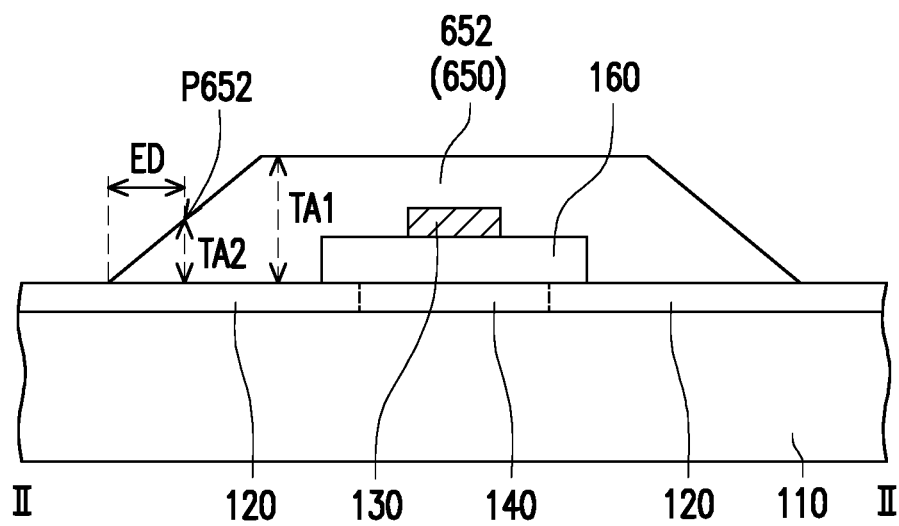
FIG. 10 is a partial sectional schematic view of a touch panel according to still another embodiment of the invention.

The island insulators 150, 250, 350, 450 and 550 can utilize outer contour shapes to achieve an improvement in the displaying quality, but not limited thereto. In certain embodiments, the varied thicknesses of the island insulators 150, 250, 350, 450 and 550 may change traveling directions of the reflective light. For instance, FIG. 10 is a partial sectional schematic view of a touch panel according to still another embodiment of the invention. Here, the section of FIG. 10 corresponds to, for example, the line II-II in FIG. 1. For instance, a section structure of FIG. 10 may be one approach for implementing of the touch panel 100 of FIG. 1. Accordingly, the same member in FIG. 10 and FIG. 1 is marked by the same reference number and not repeatedly described hereinafter. In FIG. 10, the sensing electrodes 120 and the connection line 140 are disposed on the substrate 110, the separation insulator 160 is disposed on the connection line 140, the bridge line 130 is disposed on the separation insulator 160, and an island insulator 650 covers the bridge line 130 and the separation insulator 160. In this embodiment, the island insulator 650 can include a central portion 652 and a distal portion (not illustrated in FIG. 0.10) as any one of those shown in FIG. 5 to FIG. 7. A maximum thickness of the central portion 652 is TA1, and when a thickness TA2 of the central portion 652 at a reference point P652 is one half the maximum thickness TA1, a distance ED from the reference point P652 extending outwardly in a width direction to an outer edge of the central portion 652 is, for example, from 5 μm to 10 μm. Accordingly, a periphery of the central portion 62 has a side slope with a gentle slope.

When light irradiates onto the island insulator 650, the gentle side slope can reflect the light in different directions, and can thus help to reduce the visibility of the island insulator 650. Therefore, both the design of the thickness with the gentle side slope and the design of the contour with the varied width can help to improve the displaying quality of the touch panel 100. The gentle side slope of the island insulator 650 is applicable to the central portions or the distal portions of one or many of the island insulators 150, 250, 350, 450 and 550 in the foregoing embodiments to reduce the visibility of the island insulator.

In summary, according to the embodiments of the invention, the island insulator is disposed on the bridge line to protect the bridge line from damages. Meanwhile, the island insulator according to the embodiments of the invention has the varied width, the gentle side slope or both. Accordingly, the reflective light caused by the island insulator being less likely to concentrate in a specific direction can help to reduce the visibility of the island insulator and the member encapsulated therein. As a result, the quality of the touch panel may be improved, and applicability of the touch panel may also be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch panel, comprising:
    a substrate;
    a plurality of sensing electrodes, disposed on the substrate in parallel;
    a bridge line, disposed on the substrate and connected between two of the sensing electrodes;
    a connection line, disposed on the substrate and connected between another two of the sensing electrodes, the bridge line intersecting the connection line; and
    an island insulator, disposed on the substrate and covering the bridge line, the bridge line being completely encapsulated between the island insulator and the substrate, wherein the island insulator comprises a central portion and a distal portion extended from the central portion, a width of the distal portion is gradually reduced outwardly from the central portion in a direction, a contour of the distal portion has an end and a side edge connected between the end and the central portion, a distance between two ends of the side edge in the direction is L, a distance between the bridge line and the end in the direction is r, a line width of the bridge line is w, a width of the central portion is h, an included angle of the side edge with respect to the direction is $\Theta$, and L=(h−w)/2−r×tan ($\Theta$/2).

2. The touch panel according to claim 1, wherein an extending direction of the island insulator is substantially identical to an extending direction of the bridge line.

3. The touch panel according to claim 2, wherein at least a part of the contour of the distal portion obliquely intersects the extending direction of the bridge line.

4. The touch panel according to claim 1, wherein $\Theta$ is from 30 degrees to 60 degrees.

5. The touch panel according to claim 1, wherein r is from 5 μm to 30 μm.

6. The touch panel according to claim 1, wherein the bridge line extends in the direction.

7. The touch panel according to claim 1, wherein an overall length of the island insulator in the direction is Loc, an overall length of the bridge line in the direction is Lbr, and r=(Loc−Lbr)/2.

8. The touch panel according to claim 1, wherein the central portion has a zigzag edge or a step-like edge.

9. The touch panel according to claim 1, wherein a thickness of the central portion is reduced outwardly from a center of the central portion.

10. The touch panel according to claim 9, wherein the thickness of the central portion at a reference point is one half a maximum thickness of the central portion, and a distance from the reference point extending outwardly to an outer edge of the central portion is from 5 μm to 10 μm.

11. The touch panel according to claim 1, wherein the width of the distal portion is gradually reduced outwardly from the central portion at an inconstant rate.

12. The touch panel according to claim 1 further comprising a separation insulator, the separation insulator being disposed between the bridge line and the connection line.

13. The touch panel according to claim 12, wherein an exceeding width of the separation insulator exceeding outwardly from a lateral edge of the bridge line is from 5 μm to 30 μm.

14. The touch panel according to claim 12, wherein the island insulator covers the separation insulator, and an exceeding width of the island insulator exceeding from a lateral edge of the separation insulator is from 5 μm to 30 μm.

15. The touch panel according to claim 12, wherein the separation insulator is completely encapsulated between the island insulator and the substrate.

16. The touch panel according to claim 1, wherein the connection line is integrally formed with the another two of the sensing electrode.

* * * * *